(12) United States Patent
Kimura et al.

(10) Patent No.: US 9,553,554 B2
(45) Date of Patent: Jan. 24, 2017

(54) SIGNAL PROCESSING DEVICE

(75) Inventors: Masaru Kimura, Tokyo (JP); Kohei Teramoto, Tokyo (JP); Takashi Yamazaki, Tokyo (JP); Takuya Taniguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 99 days.

(21) Appl. No.: 14/359,725

(22) PCT Filed: Jun. 4, 2012

(86) PCT No.: PCT/JP2012/064382
§ 371 (c)(1),
(2), (4) Date: May 21, 2014

(87) PCT Pub. No.: WO2013/183102
PCT Pub. Date: Dec. 12, 2013

(65) Prior Publication Data
US 2014/0321668 A1 Oct. 30, 2014

(51) Int. Cl.
*H03G 11/00* (2006.01)
*H03G 3/00* (2006.01)
(Continued)

(52) U.S. Cl.
CPC .............. *H03G 3/00* (2013.01); *H03G 5/165* (2013.01); *H03G 9/005* (2013.01); *H03G 9/025* (2013.01);
(Continued)

(58) Field of Classification Search
CPC .......... H03G 3/00; H03G 5/165; H03G 9/005; H03G 9/025; H04R 3/007; H04R 3/00; H04R 3/04; H04R 29/00
See application file for complete search history.

(56) References Cited

U.S. PATENT DOCUMENTS 4,583,245 A * 4/1986 Gelow .................. H04R 3/007
381/100
5,548,650 A * 8/1996 Clark .................... H04R 3/002
381/100
(Continued)

FOREIGN PATENT DOCUMENTS

JP          59 25822         2/1984
JP         2003 503989      1/2003
(Continued)

OTHER PUBLICATIONS

International Search Report Issued Jul. 31, 2012 in PCT/JP12/064382 Filed Apr. 6, 2012.
(Continued)

*Primary Examiner* — Andrew L Sniezek
(74) *Attorney, Agent, or Firm* — Oblon, McClelland, Maier & Neustadt, L.L.P.

(57) ABSTRACT

A signal processing device includes an excessive input estimating unit that estimates excessive input of a target signal, a controller that calculates frequency characteristics which will lessen the excessive input of the target signal from the excessive input information estimated by the excessive input estimating unit, and a frequency characteristic modification unit that modifies the frequency characteristics of the target signal in accordance with the frequency characteristics the controller calculates.

8 Claims, 8 Drawing Sheets

(51) Int. Cl.
*H04R 3/00* (2006.01)
*H04R 3/04* (2006.01)
*H03G 5/16* (2006.01)
*H03G 9/00* (2006.01)
*H03G 9/02* (2006.01)
*H04R 29/00* (2006.01)

(52) U.S. Cl.
CPC ............... *H04R 3/007* (2013.01); *H04R 3/04* (2013.01); *H04R 29/001* (2013.01); *H04R 3/00* (2013.01); *H04R 29/00* (2013.01)

(56) References Cited

U.S. PATENT DOCUMENTS

| | | | |
|---|---|---|---|
| 6,865,274 B1 | 3/2005 | Aarts et al. | |
| 9,154,101 B2* | 10/2015 | Dhuyvetter | H03G 7/002 |
| 2004/0086140 A1* | 5/2004 | Fedigan | H04R 3/00 |
| | | | 381/96 |
| 2008/0170723 A1 | 7/2008 | Sakagami et al. | |
| 2008/0273718 A1 | 11/2008 | Ohkuri et al. | |
| 2012/0281844 A1* | 11/2012 | Luo | H03F 1/52 |
| | | | 381/55 |
| 2013/0259245 A1* | 10/2013 | Cheng | H04R 3/00 |
| | | | 381/58 |

FOREIGN PATENT DOCUMENTS

| | | |
|---|---|---|
| JP | 2008 263583 | 10/2008 |
| JP | 2009 147701 | 7/2009 |
| WO | 2006 093256 | 9/2006 |

OTHER PUBLICATIONS

Office Action issued May 24, 2016, in Chinese Patent Application No. 201280065684.2 (with Partial English-language Translation).

* cited by examiner

PRIOR ART

SIGNAL PROCESSING DEVICE

TECHNICAL FIELD

The present invention relates to a signal processing technique for improving distortion or crackling noise in audio signal reproduction.

BACKGROUND ART

As for a speaker reproduction system that reproduces an audio signal such as music or announcement with a speaker, there are some cases where the quality of sound deteriorates because of distortion or crackling noise. The cause of the distortion or crackling noise is divided broadly into two categories. The first is the case where the input signal to a speaker is distorted, and the second is the case where the distortion or crackling noise occurs because the input signal exceeds the reproduction limit of a speaker even though it does not have distortion.

The first case can be explained as follows. Recently, an increasing number of audio signal reproduction systems correct the frequency characteristics or adjust the volume by digital processing. As for the correction of the frequency characteristics, if a high frequency component is increased by 10 dB, for example, there occurs a possibility that the digital signal saturates at the volume not less than −10 dBFS. Here, 0 dBFS represents the maximum amplitude of the digital signal. Accordingly, the reproduced sound is digitally distorted at high volume so that the quality of sound deteriorates. FIG. 2 shows its behavior.

In FIG. 2, the vertical axis shows the amplitude intensity of the digital signal, and the horizontal axis shows the frequency. In addition, the region where the signal is saturated and the crackling noise occurs is shown by gray, and the border is denoted by a thick line. Reference numerals 201, 202 and 203 designate an example of frequency characteristics of the digital audio signal with its frequency characteristics being corrected: 201 denotes the characteristics when the volume is low; 202 designates the characteristics when the volume is moderate; and 203 denotes the characteristics when the volume is high. At the volume designated by 201 or 202, since the audio signal does not exceed 0 dBFS, no crackling noise occurs, which enables enjoying the original quality of sound. However, if the volume is increased as denoted by 203, the signal intensity of a part of the high frequency component exceeds 0 dBFS and is saturated digitally. If the signal saturates, it causes distortion or crackling noise, which deteriorates the quality of sound.

Thus, when trying to reproduce the digital signal with its frequency characteristics being corrected at a high volume, there are some cases where a particular frequency component exceeds 0 dBFS, the maximum amplitude of the digital signal. This will cause the saturation of the signal, which brings about the distortion or crackling noise.

Next, the second case will be described which will bring about distortion or crackling noise because of exceeding the reproduction limit of the speaker.

In the speaker reproduction, the diaphragm of a speaker has a maximum displacement it can vibrate. If a signal exceeding it is input, the speaker diaphragm cannot vibrate well, which can cause distortion or crackling noise. Here, the displacement of the speaker diaphragm depends on the frequency of the input signal. FIG. 3 shows the relationships. FIG. 3 shows the displacement of the speaker diaphragm when a signal is input to a speaker while varying only its frequency with its voltage (V) being maintained. Incidentally, in FIG. 3, although the actual characteristics around F0 vary in such a manner as to become rounder or flatter than those of FIG. 3 because of the difference in the Q-value representing the damping degree, a general tendency is consistent. In addition, since the present invention is applicable to a speaker with characteristics different from the displacement characteristics shown in FIG. 3, the following description will be made on the assumption that the displacement characteristics of the speaker diaphragm are as shown in FIG. 3 for the sake of convenience of description.

As shown in FIG. 3, the displacement of the speaker diaphragm is approximately constant at frequency components lower than F0 (the minimum resonant frequency of the speaker), and decreases with a slope of about −12 dB/oct for the frequency components higher than F0. This indicates that the speaker diaphragm vibrates with the greater displacement when the lower frequency components near F0 are input to the speaker than when the higher frequency components are input. Accordingly, when the signal including a lot of low frequency components are input to the speaker and its voltage is raised, its displacement will exceed the maximum displacement of the diaphragm at a certain voltage or higher. In other words, as the signal includes more low frequency components and its voltage increases, it is likely that the displacement will exceed the reproduction limit of the speaker. FIG. 4 shows the behavior.

In FIG. 4, the vertical axis shows the amplitude intensity of the signal, and the horizontal axis shows its frequency. Besides, the region where the displacement exceeds the displacement limit of the speaker diaphragm and hence the crackling noise occurs is shown in gray, and its border is indicated by a thick line. Here, since the characteristics of FIG. 4 are characteristics for the amplitude of the audio signal, the displacement limit of the speaker diaphragm has a slope of +12 dB/oct which differs from the slope of the characteristics of the displacement of the speaker shown in FIG. 3.

In addition, reference numerals 401, 402 and 403 denote frequency characteristics of the audio signal reproduced with the speaker on the assumption that the signal includes a lot of low frequency components in particular. The reference numeral 401 designates the characteristics when the volume is low, 402 denotes the characteristics when the volume is moderate, and 403 designates the frequency characteristics when the volume is high. As long as the reproduction is carried out at the low volume as indicated by 401, even the audio signal including a lot of low frequency components does not cause the speaker diaphragm to exceed its maximum displacement. Thus, the crackling noise does not occur, which enables enjoying the original quality of sound. However, as denoted by 402 or 403, when the volume is raised, the speaker diaphragm will exceed its maximum displacement, which can cause distortion or crackling noise to occur, and deteriorate the quality of sound.

In this way, when the signal that will cause the diaphragm to exceed the maximum displacement is input, the diaphragm cannot vibrate well, thereby resulting in the distortion or crackling noise.

Since the distortion or crackling noise is not contained in the original audio signal, they will greatly hamper enjoying music.

As for the problem, the distortion or crackling noise is reduced by a processing configuration as shown in FIG. 13 conventionally. In FIG. 13, the configuration passes an input signal 1301 through a HPF (high-pass filter) 1302 that suppresses the low frequency components, and outputs as a signal 1303. Since the configuration can suppress the low frequency components that will cause the crackling noise before inputting to the speaker, it can reduce the ratio of producing the distortion or crackling noise. However, since the conventional technique suppresses the low frequency components through the HPF 1302, even when the signal to be reproduced has only a small amount of low frequency components and the crackling noise does not occur when driving the speaker with high voltage, since the low frequency components are always suppressed, it offers a problem of being unable to reproduce the original sound. In addition, even when the crackling noise will not occur without passing through the high-pass filter 1302 because the driving voltage of the speaker is not so high, the conventional technique always suppresses the low frequency components, which offers a problem of being unable to reproduce the original sound. In other words, the conventional technique has a problem of hampering a listener from enjoying the original quality of sound by excessively suppressing the low frequency components to prevent the crackling noise at the large voltage driving (at the high volume).

As a technique to relieve the problems, there is a technique disclosed in Patent Document 1, for example. FIG. 14 is a block diagram of the processing of an amplitude limiting device disclosed in the Patent Document 1. According to the Patent Document 1, in the amplitude limit for suppressing the excessive input, it detects the amount of distortion due to amplitude limit characteristics, and controls the gain of each frequency band in accordance with the amount, thereby reducing the deterioration of the quality of sound due to the amplitude limit.

PRIOR ART DOCUMENT

Patent Document

Patent Document 1: Japanese Patent Laid-Open No. 2009-147701.

DISCLOSURE OF THE INVENTION

Problems to be Solved by the Invention

However, the technique disclosed in the foregoing Patent Document 1 has a problem of deteriorating the quality of sound by excessively suppressing a frequency component that is not to be suppressed originally because a frequency component to be suppressed is fixed to a bandwidth of the division. For example, consider the case where a bandwidth of a subband divided by a BPF (band-pass filter) is 100 Hz. In this case, if a signal which has a high intensity frequency component at 60 Hz or less is input, the crackling noise can be prevented primarily by only suppressing the signal component of 60 Hz or less. The foregoing technique, however, suppresses the intensity of the entire signal component from 0 to 100 Hz, thereby suppressing the component (component from 60 to 100 Hz) other than the frequency component to be suppressed. In addition, although the displacement of the speaker diaphragm has frequency characteristics as shown in FIG. 3, the amplitude limiting device disclosed in the Patent Document 1 does not have the processing configuration that reflects the frequency characteristics of the displacement. Accordingly, it may safely be said that it does not have a function of preventing the crackling noise produced if the displacement exceeds the maximum displacement of the speaker diaphragm.

The present invention is implemented to solve the foregoing problems. Therefore it is an object of the present invention to provide a signal processing device capable of preventing the distortion and crackling noise at the speaker reproduction while maintaining the quality of sound.

Means for Solving the Problem

A signal processing device in accordance with the present invention comprises: an excessive input estimating unit that estimates excessive input of a target signal; a controller that calculates frequency characteristics that will lessen the excessive input of the target signal in accordance with excessive input information estimated by the excessive input estimating unit; and a frequency characteristic modification unit that modifies frequency characteristics of the target signal in accordance with the frequency characteristics the controller calculates.

Advantages of the Invention

According to the present invention, it can prevent the distortion or crackling noise in the speaker reproduction while maintaining the quality of sound.

BEST MODE FOR CARRYING OUT THE INVENTION

The best mode for carrying out the invention will now be described with reference to the accompanying drawings to explain the present invention in more detail.

Embodiment 1

Figure 1:
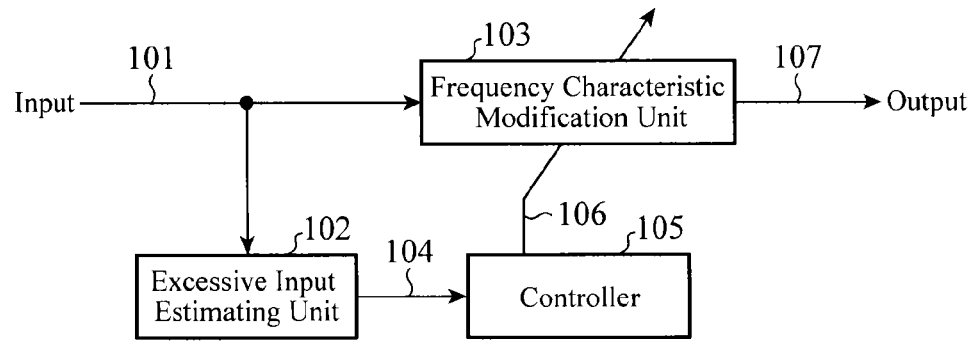
FIG. 1 is a diagram showing a principle of a signal processing device of an embodiment 1.
Figure 2:
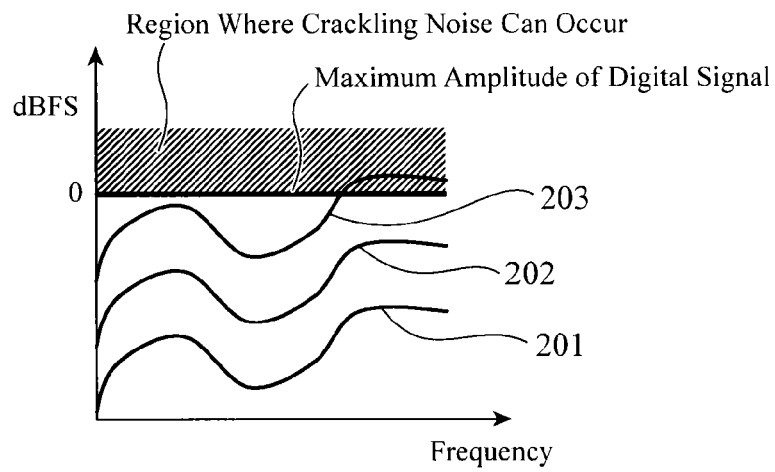
FIG. 2 is a diagram illustrating relationships between amplitude limits of a digital signal and frequency characteristics of a sound source.
Figure 3:
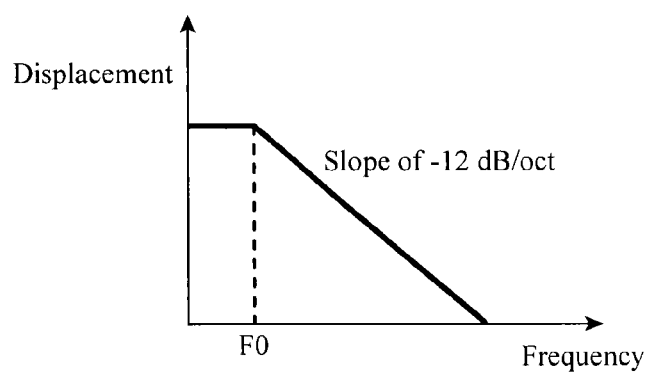
FIG. 3 is a diagram illustrating displacement characteristics of a speaker diaphragm.
Figure 4:
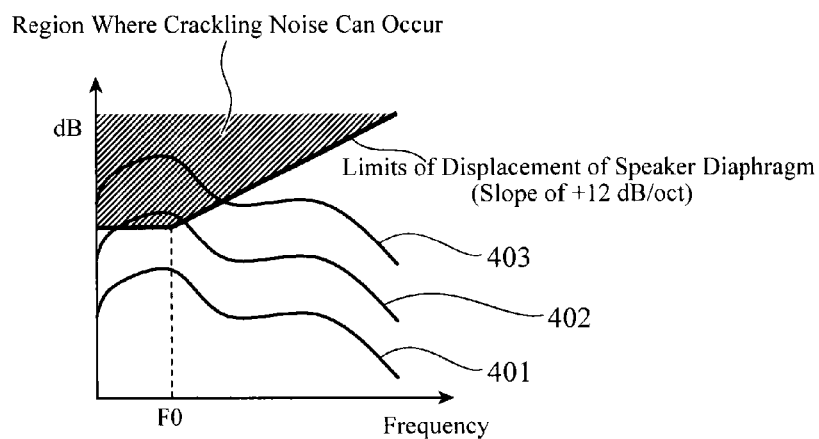
FIG. 4 is a diagram illustrating relationships between vibration limits of a speaker and frequency characteristics of a sound source.

FIG. 1 is a diagram showing a principle of the present invention. The operation of the present invention will be described below.

An input signal 101 input to a signal processing device in accordance with the present invention is split and is delivered to an excessive input estimating unit 102 and a frequency characteristic modification unit 103.

The excessive input estimating unit 102 estimates as to whether the input signal 101 is an excessive input for a target speaker or not, and whether it exceeds the maximum amplitude of a digital signal, and supplies an estimation result signal 104 to a controller 105.

Using the estimation result signal 104 supplied from the excessive input estimating unit 102, the controller 105 calculates the frequency characteristics that will prevent the input signal 101 from becoming an excessive input, and delivers parameters 106 that will achieve the frequency characteristics to the frequency characteristic modification unit 103. As a concrete example of the parameters 106, there are filter coefficients that will modify the frequency characteristics.

The frequency characteristic modification unit 103 modifies the frequency characteristics of the input signal 101 in accordance with the parameters 106 delivered from the controller 105, and outputs an output signal 107. If the parameters 106 are filter coefficients, the frequency characteristic modification unit carries out the filter processing using the coefficients 106.

As described above, the processing configuration of the embodiment 1 can prevent the reproduction audio signal from becoming an excessive input. Accordingly, the present invention offers an advantage of being able to suppress the distortion or crackling noise. In addition, the controller prevents the distortion or crackling noise from occurring while reducing the modification of the frequency characteristics as much as possible, which offers an advantage of being able to prevent the distortion or crackling noise with the minimum necessary frequency characteristic modification.

Embodiment 2

Figure 5:
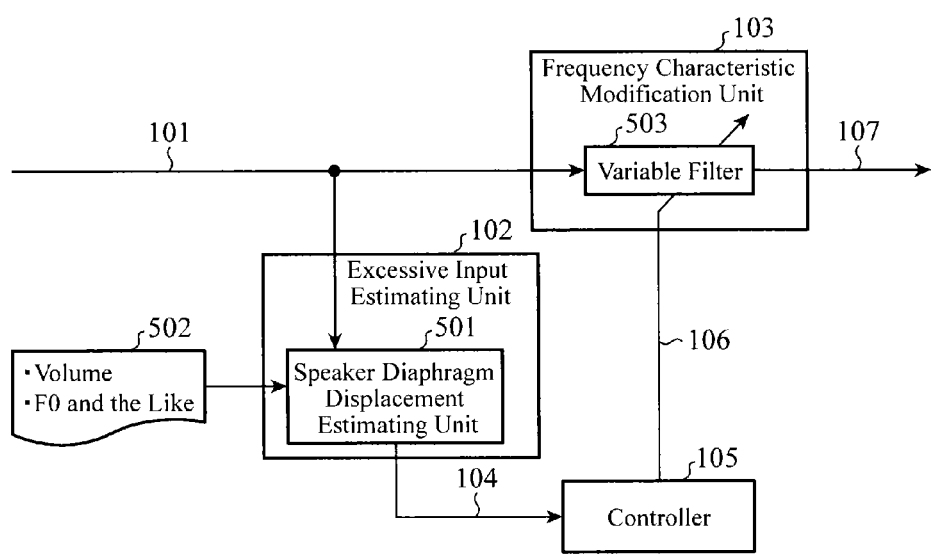
FIG. 5 is a diagram showing a principle of a signal processing device of an embodiment 2.

FIG. 5 is a diagram showing another embodiment in accordance with the present invention. The present embodiment shows an example that modifies the frequency characteristics of the audio signal so as to prevent the speaker diaphragm from exceeding its displacement limits. The operation of the present embodiment will be described below.

The input signal 101 input to the signal processing device in accordance with the present invention is split and is delivered to the excessive input estimating unit 102 and the frequency characteristic modification unit 103.

The excessive input estimating unit 102 of the present embodiment is characterized by comprising a speaker diaphragm displacement estimating unit 501. The speaker diaphragm displacement estimating unit 501 estimates the displacement of the speaker diaphragm from information 502 such as the volume and F0 of the target speaker and from the input signal 101. As a concrete example of the displacement estimation, a LPF using a second-order IIR filter with a cutoff frequency F0 is prepared. Then passing the input signal 101 through the LPF, followed by multiplying the volume, will give a value approximately proportional to the displacement of the target speaker. In addition, as for the LPF using the second-order IIR filter, since it can alter its Q-value, it can improve the estimation accuracy by varying the Q-value in response to the damping degree of the target speaker. It goes without saying that other methods are possible such as simulating the displacement characteristics of the diaphragm of the target speaker by an FIR filter.

The speaker displacement thus obtained is supplied to the controller 105 as the estimation result signal 104.

The controller 105 carries out HPF processing of the estimation result signal 104 supplied, and obtains the filter coefficients of the HPF that will place the amplitude of the displacement estimation signal within a prescribed threshold. The prescribed threshold is a value that is approximately equal to the maximum displacement of the diaphragm of the target speaker. As a calculation method of the filter coefficients of the HPF, set the cutoff frequency of the HPF at a low frequency (20 Hz, for example) first, gradually increase the cutoff frequency, and obtain the cutoff frequency that will place the amplitude of the output signal of the HPF at a value not greater than the threshold. Then deliver the filter coefficients at this time to the frequency characteristic modification unit 103.

The frequency characteristic modification unit 103 of the present embodiment comprises a variable filter 503. The variable filter 503 carries out the filter processing of the input signal 101 by using the filter coefficients 106 delivered by the controller 105, and outputs the resultant signal as the output signal 107.

As described above, the processing configuration of the embodiment 2 can suppress the displacement of the speaker diaphragm in which the intensity of the low frequency component is predominant. Accordingly, it offers an advantage of being able to prevent the distortion or crackling noise. In addition, the controller of the present embodiment can make the cutoff frequency of the HPF as low as possible. Accordingly, it offers an advantage of being able to prevent the distortion or crackling noise with the minimum necessary modification of the frequency characteristics.

Embodiment 3

Figure 6:
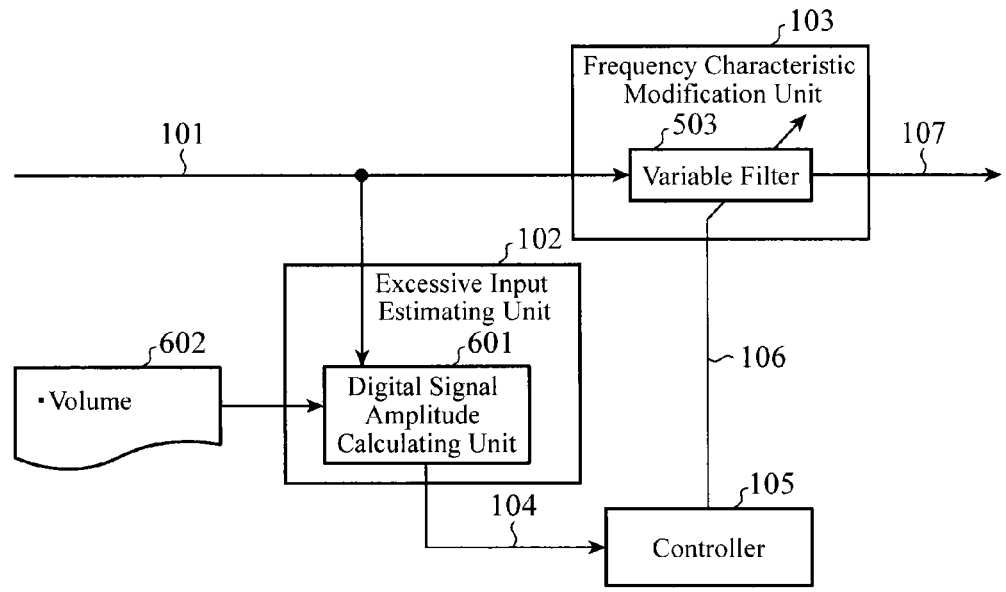
FIG. 6 is a diagram showing a principle of a signal processing device of an embodiment 3.

FIG. 6 is a diagram illustrating another embodiment in accordance with the present invention. The present embodiment shows an example that modifies, in a digital audio signal passing through the frequency characteristic correction that much corrects its high frequency components, the frequency characteristics of the signal so as not to exceed the maximum amplitude of the digital signal. The operation of the present embodiment will be described below.

The input signal 101 input to the signal processing device in accordance with the present invention is split and is delivered to the excessive input estimating unit 102 and the frequency characteristic modification unit 103.

The excessive input estimating unit 102 of the present embodiment is characterized by comprising a digital signal amplitude calculating unit 601. The digital signal amplitude calculating unit 601 obtains the amplitude after the volume processing by multiplying the volume 602 and the input signal 101 and supplies the resultant amplitude to the controller 105 as the estimation result signal 104.

The controller 105 carries out the LPF processing of the estimation result signal 104 supplied, that is, of the amplitude, and obtains the filter coefficients of the LPF in such a manner that the signal after the LPF processing comes within a prescribed threshold. As for the prescribed threshold, although it is usually set at 0 dBFS, it is not limited to that. For example, it can be set at a value lower than that if the matching between the speaker input tolerance and the amplifier output is not established, and it is desirable to limit the output of the amplifier. As a method of calculating the filter coefficients of the LPF, it sets the cutoff frequency of the LPF at a rather high value (20 KHz, for example), gradually lowering the cutoff frequency, and obtains the cutoff frequency at which the amplitude of the output signal of the LPF becomes equal to or less than the threshold. In addition, it supplies the filter coefficients at that time to the frequency characteristic modification unit 103.

As in the embodiment 2, the frequency characteristic modification unit 103 of the present embodiment also comprises a variable filter 503. The variable filter 503 carries out the filter processing of the input signal 101 using the filter coefficients 106 delivered from the controller 105, and supplies the resultant signal as the output signal 10.

As described above, the processing configuration of the embodiment 3 can suppress the amplitude of the digital audio signal having its high frequency components much corrected, offering an advantage of being able to suppress the distortion or crackling noise. In addition, since the controller of the present embodiment can set the cutoff frequency of the LPF as high as possible, it offers an advantage of being able to prevent the distortion or crackling noise with the minimum necessary modification of the frequency characteristics.

Embodiment 4

Figure 7:
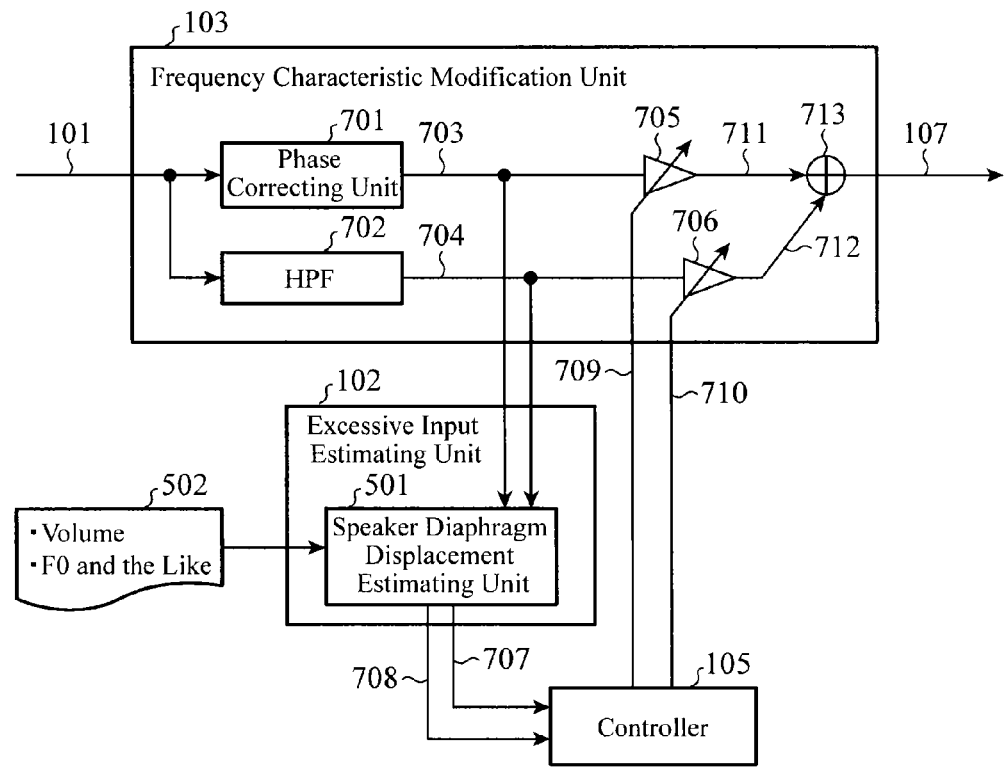
FIG. 7 is a diagram showing a principle of a signal processing device of an embodiment 4.

FIG. 7 is a diagram illustrating another embodiment in accordance with the present invention. In the present embodiment, the frequency characteristic modification unit 103 is characterized by comprising a fixed filter, a phase correcting unit, a plurality of multipliers and an adder instead of the variable filter. The operation of the present embodiment will be described below.

The input signal 101 supplied to the signal processing device in accordance with the present invention is split and it delivered to the phase correcting unit 701 and HPF 702.

The phase correcting unit 701, while maintaining the frequency amplitude characteristics of the input signal 101, corrects only its phase characteristics in such a manner that the phase characteristics become nearly equal to the phase characteristics of the HPF 702, and supplies the resultant signal 703 to the first multiplier 705 and excessive input estimating unit 102.

The HPF 702 carries out the filter processing of the input signal 101, and supplies the resultant signal 704 to the second multiplier 706 and excessive input estimating unit 102.

Here, a method of implementing the phase correcting unit 701 that corrects the phase in such a manner as to become nearly equal to the phase characteristics of the HPF 702 will be described below. When implementing the HPF 702 with a single stage of a second-order IIR filter, its phase characteristics rotate just 90 degrees at the cutoff frequency and gradually rotate at the following frequency components until 180 degrees. A phase correcting unit that will achieve such phase characteristics can be constructed by an all-pass filter based on a first-order IIR filter. In addition, when implementing the HPF with two stages of second-order IIR filters, its phase characteristics rotate just 180 degrees at the cutoff frequency and gradually rotate at the following frequency components until 360 degrees. A phase correcting unit that will achieve such phase characteristics can be constructed by an all-pass filter based on a second-order IIR filter. In addition, when implementing the HPF with N stages of second-order IIR filters, the same phase characteristics can be achieved by appropriately connecting all-pass filters of the first-order IIR and all-pass filters of the second-order IIR in series. In addition, when implementing the HPF with an FIR filter, since the phase characteristics have a linear phase, the phase correcting unit can be configured by sampling-delay processing. Thus, the phase correcting unit 701 with the same phase characteristics as the HPF 702 can be implemented.

The excessive input estimating unit 102 of the present embodiment comprises the speaker diaphragm displacement estimating unit 501 as the embodiment 2. The speaker diaphragm displacement estimating unit 501 estimates the displacement of the speaker diaphragm when reproducing the signal 703 by using the information 502 such as the volume and F0 of the target speaker, and obtains a first speaker diaphragm displacement 707. Likewise, it estimates the displacement of the speaker diaphragm when reproducing the signal 704, and obtains a second speaker diaphragm displacement 708. As for a concrete method of the displacement estimation, since the displacement can be obtained by the same method as that of the embodiment 2, the detailed description will be omitted.

The two speaker diaphragm displacements 707 and 708 thus obtained is supplied to the controller 105.

The controller 105 obtains the two gain coefficients in such a manner that when the two input speaker diaphragm displacements 707 and 708 are multiplied by the gain coefficients which differ from each other, respectively, followed by addition, the absolute value of the amplitude comes within the prescribed threshold, where the sum of the two gain coefficients is assumed to be one.

Figure 8:
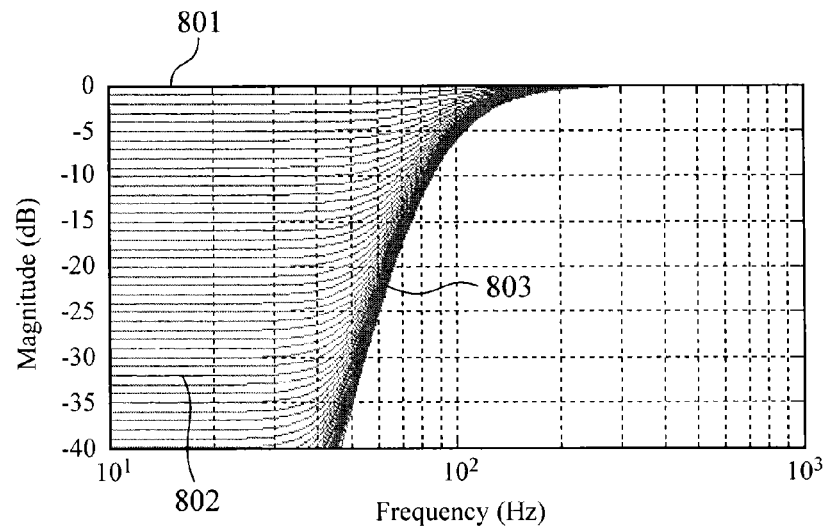
FIG. 8 is a diagram showing frequency characteristics due to two gain coefficients of the signal processing device of the embodiment 4.

Varying the two gain coefficients under such conditions can implement different low frequency attenuation effects. FIG. 8 shows transitions of frequency characteristics due to the two gain coefficients when implementing the HPF 702 with two stages of the second-order IIR filters with a cutoff frequency of 80 Hz and implementing the phase correcting unit 701 with a single stage of the all-pass filter of a second-order IIR with a cutoff frequency of 80 Hz. In addition, assuming that the gain coefficient for the speaker diaphragm displacement 707 is A1, and the gain coefficient for the speaker diaphragm displacement 708 is A2 in FIG. 8, the line 801 shows characteristics of A1=1.0 and A2=0.0, and the curve 802 shows characteristics of A1=0.1 and A2=0.9, and the curve 803 shows characteristics of A1=0.0 and A2=1.0. This indicates that different low frequency attenuation characteristics can be implemented between the completely flat characteristics (A1=1.0, A2=0.0) and the same characteristics as the two stages of the second-order IIR filters with the cutoff frequency of 80 Hz A1=0.0, A2=1.0). In addition, as for the frequency components not less than the cutoff frequency, since the components with the same phase are added at the ratios of one in total, the flat characteristics can be maintained without any fluctuations of intensity.

A concrete method of calculating such two gain coefficients can be implemented by obtaining A1 and A2 that will satisfy the following Expression (1), in which X1 is the speaker diaphragm displacement 707, X2 is the speaker diaphragm displacement 708, A1 is the gain coefficient corresponding to X1, A2 is the gain coefficient corresponding to X2, and T is the prescribed threshold.

$$T > ABS(X1*A1 + X2*A2)$$

$$A1 + A2 = 1 \qquad (1)$$

where ABS(x) denotes the absolute value of x.

In addition, to limit the modification of the frequency characteristics to a minimum necessary amount, it is desirable to obtain a combination in which the value A1 is close to one among the combinations of A1 and A2 that satisfy the foregoing Expression (1). This is because X1 is the signal resulting from the correction of only the phase characteristics, and as A1 approaches one, the frequency characteristics have less modification. To obtain such gain coefficients, place A1=1 at first, obtain ABS(X1*A1+X2*A2) while gradually reducing the value A1, and adopt the values A1 and A2 when ABS(X1*A1+X2*A2) becomes less than T.

The value A1 thus obtained is supplied to the first multiplier 705 as the gain coefficient 709. In addition, the value A2 is supplied to the second multiplier 706 as the gain coefficient 710.

The first multiplier 705 multiplies the input signal 703 by the gain coefficient 709, and supplies the resultant signal 711 to the adder 713.

The second multiplier 706 multiplies the input signal 704 by the gain coefficient 710, and supplies the resultant signal 712 to the adder 713.

The adder 713 adds the two input signals 711 and 712, and outputs the resultant signal as the output signal 107.

As described above, the processing configuration of the embodiment 4 offers an advantage of being able to implement the frequency characteristic modification unit and the controller easily.

Embodiment 5

Figure 9:
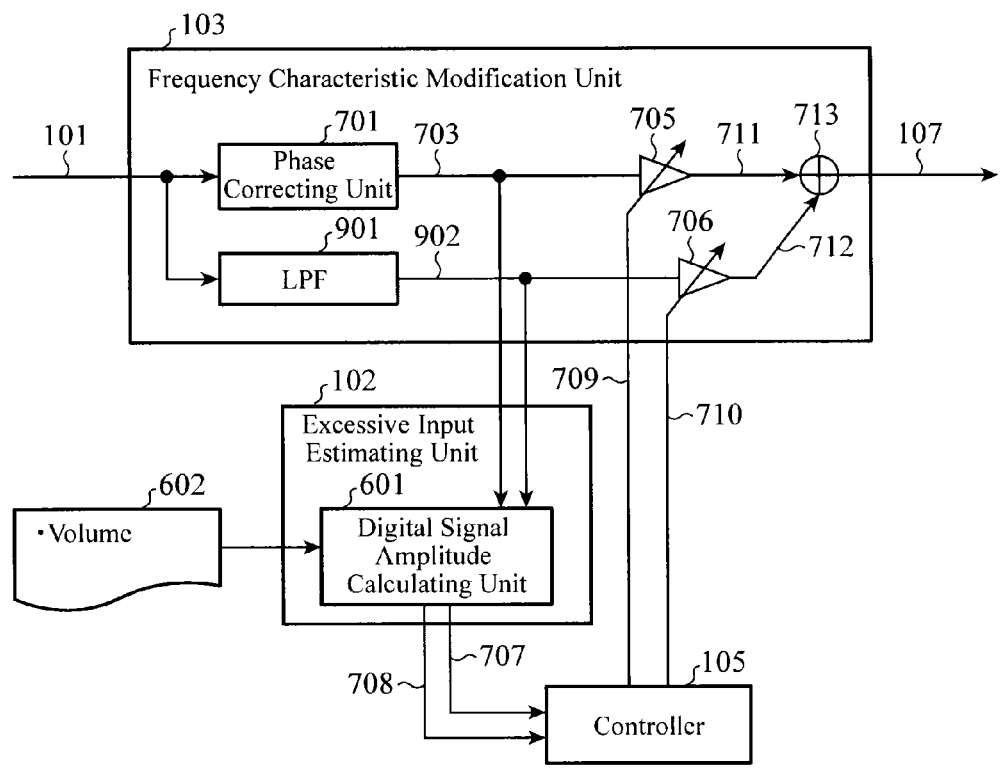
FIG. 9 is a diagram showing a principle of a signal processing device of an embodiment 5.

As for the digital audio signal passing through the frequency characteristic correction that much corrects its high frequency components, replacing the HPF 702 described in the embodiment 4 by a LPF will enable modifying the frequency characteristics of the signal so as not to exceed the maximum amplitude of the digital signal. FIG. 9 shows a processing configuration of an embodiment which replaces the HPF 702 by a LPF.

The input signal 101 supplied to the signal processing device in accordance with the present invention is split and is delivered to the phase correcting unit 701 and LPF 901.

The phase correcting unit 701, while maintaining the frequency amplitude characteristics of the input signal 101, corrects only its phase characteristics in such a manner that the phase characteristics become nearly equal to the phase characteristics of the LPF 901, and supplies the resultant signal 703 to the first multiplier 705 and excessive input estimating unit 102.

The LPF 901 carries out the filter processing of the input signal 101, and supplies the resultant signal 902 to the second multiplier 706 and excessive input estimating unit 102.

Here, since the phase correcting unit 701 can be implemented by an all-pass filter or sampling-delay processing in the same manner as that of the embodiment 4, its detailed description will be omitted.

The excessive input estimating unit 102 of the present embodiment comprises the digital signal amplitude calculating unit 601 as that of the embodiment 3. The digital signal amplitude calculating unit 601 obtains the first amplitude (speaker diaphragm displacement) 707 by multiplying the volume 602 and the input signal 703. Likewise, it obtains the second amplitude (speaker diaphragm displacement) 708 by multiplying the volume 602 and the input signal 902.

The first and second amplitudes 707 and 708 are supplied to the controller 105.

The controller 105 obtains the two gain coefficients in such a manner that when the two amplitudes 707 and 708 are multiplied by the gain coefficients which differ from each other, respectively, followed by addition, the absolute value of the amplitude comes within the prescribed threshold, where the sum of the two gain coefficients is assumed to be one.

Figure 10:
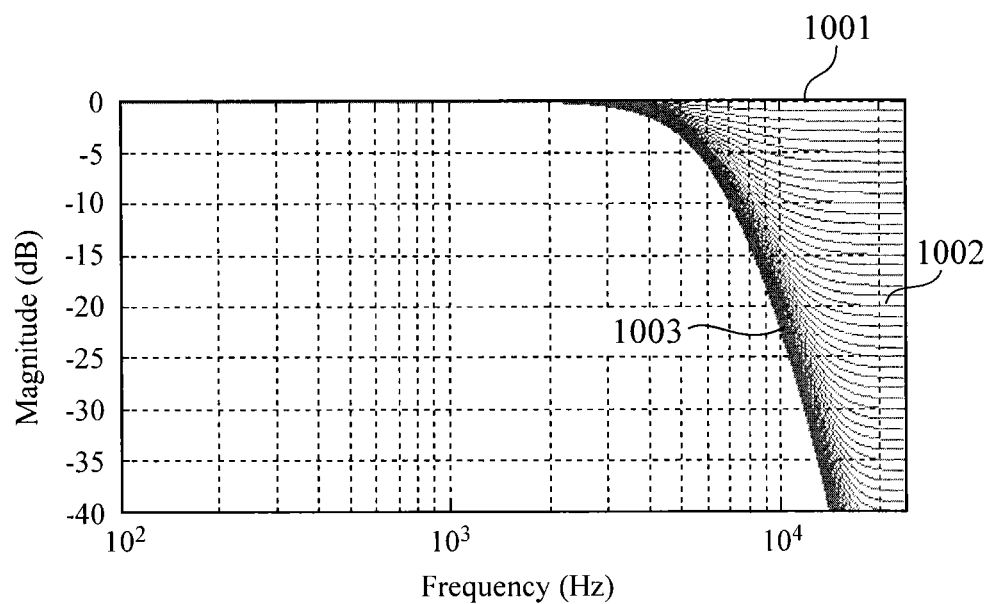
FIG. 10 is a diagram illustrating transition of frequency characteristics due to two gain coefficients of the signal processing device of the embodiment 5.

Varying the two gain coefficients under such conditions can implement different high frequency attenuation effect. FIG. 10 shows transitions of frequency characteristics due to the two gain coefficients when implementing the LPF 901 with two stages of second-order IIR filters with a cutoff frequency of 6000 Hz and implementing the phase correcting unit 701 with a single stage of the all-pass filter of a second-order IIR with a cutoff frequency of 6000 Hz. In addition, assuming that the gain coefficient for the speaker diaphragm displacement 707 is A1, and the gain coefficient for the speaker diaphragm displacement 708 is A2 in FIG. 10, the line 1001 shows characteristics of A1=1.0 and A2=0.0, and the curve 1002 shows characteristics of A1=0.1 and A2=0.9, and the curve 1003 shows characteristics of A1=0.0 and A2=1.0. This indicates that different high frequency attenuation characteristics can be implemented between the completely flat characteristics (A1=1.0, A2=0.0) and the same characteristics as the two stages of the second-order IIR filters with the cutoff frequency of 6000 Hz (A1=0.0, A2=1.0). In addition, as for the frequency components not greater than the cutoff frequency, since the components with the same phase are added at the ratios of one in total, the flat characteristics can be maintained without any fluctuations of intensity. As for a concrete calculation method of the two gain coefficients, since it calculates them in the same manner as that of the embodiment 4, the description thereof will be omitted.

The value A1 thus obtained is supplied to the first multiplier 705 as the gain coefficient 709. In addition, the value A2 is supplied to the second multiplier 706 as the gain coefficient 710.

The first multiplier 705 multiplies the signal 703 supplied by the gain coefficient 709, and supplies the resultant signal 711 to the adder 713.

The second multiplier 706 multiplies the signal 902 supplied by the gain coefficient 710, and supplies the resultant signal 712 to the adder 713.

The adder 713 adds the two signals 711 and 712 supplied, and outputs the resultant signal as the output signal 107.

As described above, the processing configuration of the embodiment 5 offers an advantage of being able to implement the frequency characteristic modification unit and the controller easily.

Embodiment 6

Although the frequency characteristic modification unit 103 is implemented by the single phase correcting unit and the single HPF or LPF in the embodiment 4 or 5, this is not essential. The frequency characteristic modification unit 103 can be implemented by a plurality of phase correcting units and a plurality of HPFs or LPFs.

Figure 11:
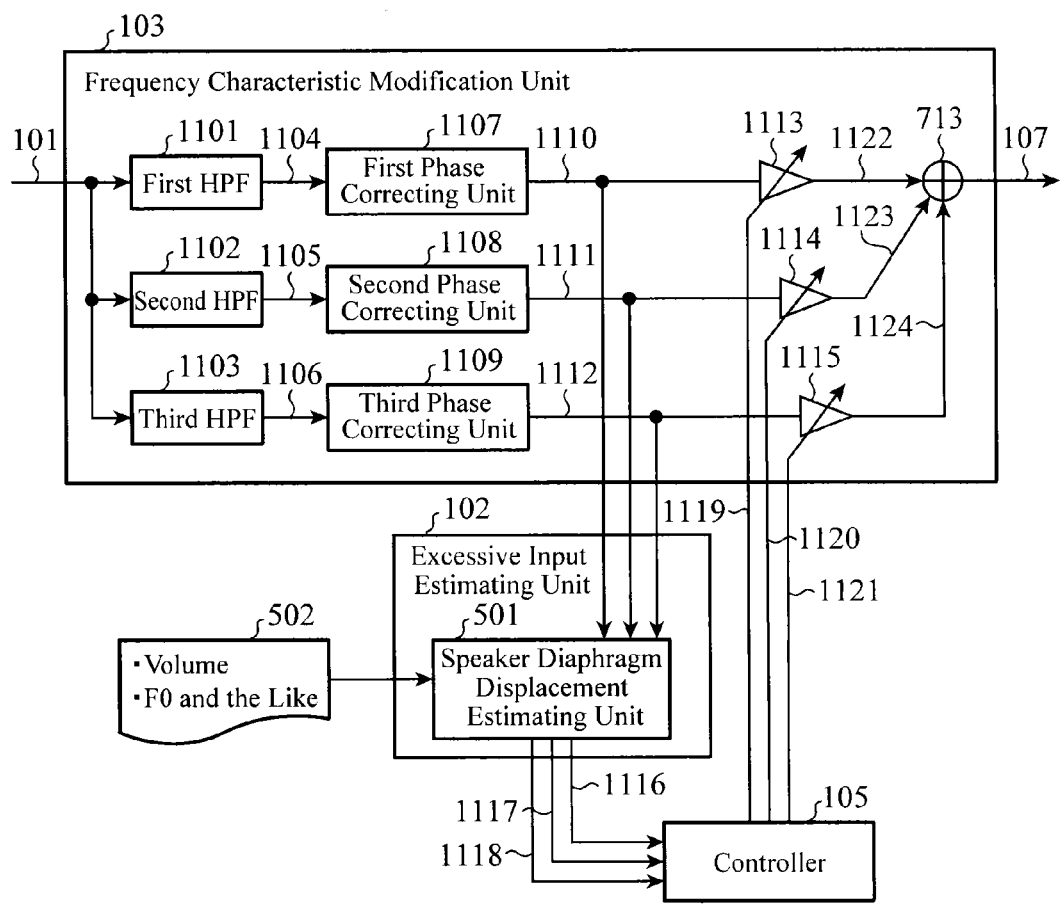
FIG. 11 is a diagram showing a principle of a signal processing device of an embodiment 6.

FIG. 11 is a diagram showing an example that implements the frequency characteristic modification unit using three phase correcting units and three HPFs. The operation of the present embodiment will be described below.

The input signal 101 supplied to the signal processing device in accordance with the present invention is split to three parts, and is delivered to a first HPF 1101, second HPF 1102, and third HPF 1103.

The first HPF 1101 carries out the filter processing of the input signal, and supplies the resultant signal 1104 to a first phase correcting unit 1107.

The second HPF 1102 carries out the filter processing of the input signal, and supplies the resultant signal 1105 to a second phase correcting unit 1108.

The third HPF 1103 carries out the filter processing of the input signal, and supplies the resultant signal 1106 to a third phase correcting unit 1109.

The first phase correcting unit 1107, while maintaining the frequency amplitude characteristics of the signal, corrects only the phase characteristics of the signal in such a manner that the phase characteristics become nearly equal to the phase characteristics when the processing of both the second HPF 1102 and third HPF 1103 has been executed, and supplies the resultant signal 1110 to a first multiplier 1113 and the excessive input estimating unit 102.

The second phase correcting unit 1108, while maintaining the frequency amplitude characteristics of the signal, corrects only the phase characteristics of the signal in such a manner that the phase characteristics become nearly equal to the phase characteristics when the processing of both the first HPF 1101 and third HPF 1103 has been executed, and supplies the resultant signal 1111 to the second multiplier 1114 and the excessive input estimating unit 102.

The third phase correcting unit 1109, while maintaining the frequency amplitude characteristics of the signal, corrects only the phase characteristics of the signal in such a manner that the phase characteristics become nearly equal to the phase characteristics when the processing of both the first HPF 1101 and the second HPF 1102 has been executed, and supplies the resultant signal 1112 to the third multiplier 1115 and the excessive input estimating unit 102.

Here, since each phase correcting unit can be implemented by an all-pass filter or sampling-delay processing as in the embodiment 4, the detailed description will be omitted.

The excessive input estimating unit 102 of the present embodiment comprises the speaker diaphragm displacement estimating unit 501. The speaker diaphragm displacement estimating unit 501 estimates the displacement of the speaker diaphragm when reproducing the signal 1110 using the information 502 such as the volume and F0 of the target speaker, and obtains the first speaker diaphragm displacement 1116. Likewise, it estimates the displacement of the speaker diaphragm when reproducing the signal 1111, and obtains the second speaker diaphragm displacement 1117. Likewise, it estimates the displacement of the speaker diaphragm when reproducing the signal 1112, and obtains the third speaker diaphragm displacement 1118.

As for a concrete example of the displacement estimation, since it is obtained in the same manner as that of the embodiment 2, its detailed description will be omitted.

The three speaker diaphragm displacements 1116, 1117 and 1118 thus obtained are supplied to the controller 105.

The controller 105 obtains the three gain coefficients in such a manner that when the three input speaker diaphragm displacements 1116, 1117 and 1118 are multiplied by gain coefficients which differ from each other, respectively, followed by addition, the absolute value of the amplitude comes within the prescribed threshold, where the sum of the three gain coefficients is assumed to be one.

Figure 12:
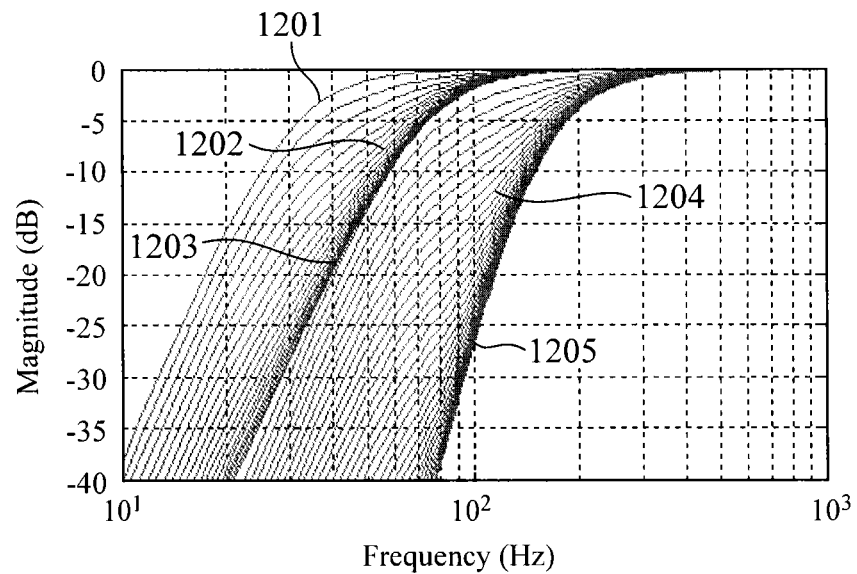
FIG. 12 is a diagram illustrating transition of frequency characteristics due to three gain coefficients of the signal processing device of the embodiment 6.
Figure 13:
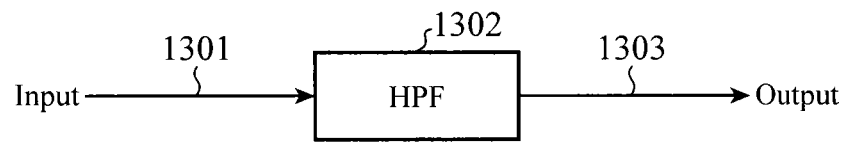
FIG. 13 is a diagram showing a principle of a conventional technique.
Figure 14:
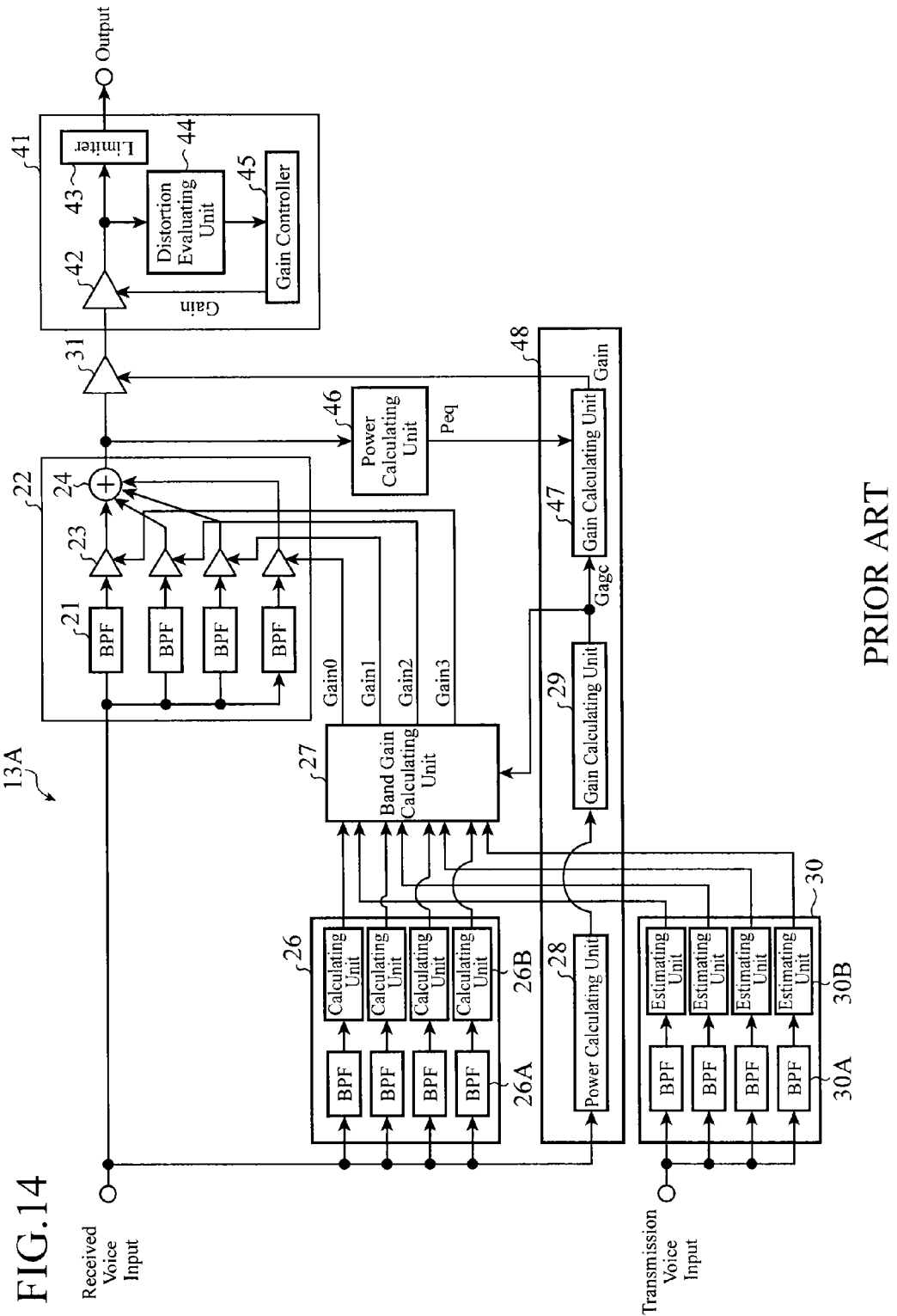
FIG. 14 is a processing block diagram of an amplitude limiting device of a conventional technique.

Varying the three gain coefficients under such conditions can implement different low frequency attenuation effects. FIG. 12 shows transition of frequency characteristics due to the three gain coefficients when implementing the first HPF 1101 with two stages of the second-order IIR filters with a cutoff frequency of 30 Hz, the second HPF 1102 with two stages of the second-order IIR filters with a cutoff frequency of 70 Hz, and the third HPF 1103 with four stages of the second-order IIR filters with a cutoff frequency 140 Hz, and implementing the first phase correcting unit 1107 with a series connection of a single stage of the second-order IIR filter with a cutoff frequency of 70 Hz and two stages of the second-order IIR filters with a cutoff frequency of 140 Hz, the second phase correcting unit 1108 with a series connection of a single stage of the second-order IIR filter with a cutoff frequency of 30 Hz and two stages of the second-order IIR filters with a cutoff frequency of 140 Hz, and the third phase correcting unit 1109 with a series connection of a single stage of the second-order IIR filter with a cutoff frequency of 30 Hz and a single stage of the second-order IIR filter with a cutoff frequency of 70 Hz.

In addition, in FIG. 12, assuming that the gain coefficient for the speaker diaphragm displacement 1116 is A1, the gain coefficient for the speaker diaphragm displacement 1117 is A2, and the gain coefficient for the speaker diaphragm displacement 1118 is A3, then the curve 1201 indicates the characteristics when A1=1.0, A2=0.0 and A3=0.0; the curve 1202 indicates the characteristics when A1=0.1, A2=0.9 and A3=0.0; the curve 1203 indicates the characteristics when A1=0.0, A2=1.0 and A3=0.0; the curve 1204 indicates the characteristics when A1=0.0, A2=0.1 and A3=0.9; and the curve 1205 indicates the characteristics when A1=0.0, A2=0.0 and A3=1.0. This indicates that different low frequency attenuation characteristics can be implemented from the completely flat characteristics (A1=1.0, A2=0.0, A3=0.0) to the characteristics of the four stages of the second-order IIR filters with the cutoff frequency of 140 Hz (A1=0.0, A2=0.0, A3=1.0). In addition, as for the frequency components not less than the cutoff frequency, since the components with the same phase are added at the ratios of one in total, the flat characteristics can be maintained without any fluctuations of intensity.

In addition, a concrete method of calculating such three gain coefficients can be implemented by obtaining A1, A2 and A3 that will satisfy the following Expression (2), in which X1 is the speaker diaphragm displacement 1116, X2 is the speaker diaphragm displacement 1117, X3 is the speaker diaphragm displacement 1118, A1 is the gain coefficient for X1, A2 is the gain coefficient for X2, A3 is the gain coefficient for X3, and T is the prescribed threshold.

$$T > ABS(X1*A1 + X2*A2 + X3*A3) \quad (2)$$

$$A1 + A2 + A3 = 1$$

where ABS(x) denotes the absolute value of x.

The value A1 thus obtained is supplied to the first multiplier 1113 as the gain coefficient 1119. In addition, the value A2 is supplied to the second multiplier 1114 as the gain coefficient 1120, and the value A3 is supplied to the third multiplier 1115 as the gain coefficient 1121.

The first multiplier 1113 multiplies the input signal 1110 by the gain coefficient 1119, and supplies the resultant signal 1122 to the adder 713.

The second multiplier 1114 multiplies the input signal 1111 by the gain coefficient 1120, and supplies the resultant signal 1123 to the adder 713.

The third multiplier 1115 multiplies the input signal 1112 by the gain coefficient 1121, and supplies the resultant signal 1124 to the adder 713.

The adder 713 adds the three input signals 1122, 1123 and 1124, and outputs the resultant signal as the output signal 107.

As described above, the processing configuration of the embodiment 6 offers an advantage of being able to implement the frequency characteristic modification unit with the three phase correcting units and the three HPFs, and to enable the frequency characteristic modification unit to achieve the characteristics closer to a common HPF than the embodiment 4 or 5.

It goes without saying that increasing the number of the phase correcting units and that of the HPFs can implement the characteristics further closer to a common HPF. In addition, as for the digital audio signal passing through the frequency characteristic correction having more correction in the high frequency components, replacing the HPFs of the configuration by LPFs will be able to modify the frequency characteristics of the signal so as not to exceed the maximum amplitude of the digital signal.

Incidentally, it is to be understood that a free combination of the individual embodiments, variations of any components of the individual embodiments or removal of any components of the individual embodiments is possible within the scope of the present invention.

INDUSTRIAL APPLICABILITY

As described above, a signal processing device in accordance with the present invention can improve the distortion or crackling noise in the audio signal reproduction, and is applicable to an audio reproduction device or the like.

DESCRIPTION OF REFERENCE SYMBOLS

101 input signal; 102 excessive input estimating unit; 103 frequency characteristic modification unit; 104 estimation result signal; 105 controller; 106 parameter; 107 output signal; 501 speaker diaphragm displacement estimating unit; 502 information; 503 variable filter; 602 the volume; 701 phase correcting unit; 702 HPF; 705 first multiplier; 706 second multiplier; 713 adder; 901 LPF; 1101 first HPF; 1102 second HPF; 1103 third HPF; 1107 first phase correcting unit; 1108 second phase correcting unit; 1109 third phase correcting unit; 1113 first multiplier; 1114 second multiplier; 1115 third multiplier.

What is claimed is:

1. A signal processing device comprising:
an excessive input estimator that estimates excessive input of a target signal based on an estimated displacement of vibrations of a diaphragm of a speaker to which the target signal is to be provided;
a controller that calculates frequency characteristics that will lessen the excessive input of the target signal in accordance with excessive input information estimated by the excessive input estimating unit; and
a frequency characteristic modifier that modifies frequency characteristics of the target signal in accordance with the frequency characteristics the controller calculates,
wherein
the excessive input estimator, when estimating the displacement of vibrations of the diaphragm constituting the speaker, configures a filter that simulates the displacement by using at least one of the volume of the speaker, minimum resonant frequency information about the speaker and a Q-value of the speaker, and outputs a resultant signal obtained by supplying the target signal to the filter, and
the filter that simulates the displacement is an infinite impulse response (IIR) filter of second order.

2. The signal processing device according to claim 1, wherein
the controller calculates the frequency characteristics that will lessen the excessive input of the target signal by altering a cutoff frequency of a high-pass filter.

3. The signal processing device according to claim 1, wherein
the excessive input estimator comprises a signal amplitude calculator that estimates a saturation state of the target signal after controlling the volume of a speaker for reproducing the target signal.

4. The signal processing device according to claim 1, wherein
the controller calculates the frequency characteristics that will lessen the excessive input of the target signal by altering a cutoff frequency of a low-pass filter.

5. The signal processing device according to claim 1, wherein the frequency characteristic modifier comprises:
a high-pass filter;
a phase corrector that corrects the phase characteristics of the target signal so as to make the phase characteristics nearly equal to phase characteristics of the high-pass filter;
a first multiplier that adjusts gain of a signal output from the phase corrector;
a second multiplier that adjusts gain of a signal output from the high-pass filter;
a coefficient calculator that determines gain coefficients of the first and second multipliers in a manner that the sum of the gain coefficient of the first multiplier and the gain coefficient of the second multiplier has a fixed value; and
an adder that adds signals output from the first and second multipliers.

6. The signal processing device according to claim 1, wherein the frequency characteristic modifier comprises:
a low-pass filter;
a phase corrector that corrects the phase characteristics of the target signal so as to make the phase characteristics nearly equal to phase characteristics of the low-pass filter;
a first multiplier that adjusts gain of a signal output from the phase corrector;
a second multiplier that adjusts gain of a signal output from the low-pass filter;
a coefficient calculator that determines gain coefficients of the first and second multipliers in a manner that the sum of the gain coefficient of the first multiplier and the gain coefficient of the second multiplier has a fixed value; and
an adder that adds signals output from the first and second multipliers.

7. The signal processing device according to claim 1, wherein the frequency characteristic modifier comprises;
a plurality of high-pass filters with different cutoff frequencies;
phase correctors that correct the phase characteristics of the target signal so as to make the phase characteristics nearly equal to phase characteristics of the individual high-pass filters;
a plurality of multipliers that adjust gains of signals output from the high-pass filters and the phase correctors;
a coefficient calculator that determines gain coefficients of the plurality of multipliers in a manner that the sum of the gain coefficients of the plurality of multipliers has a fixed value; and a plurality of adders that add signals output from the plurality of multipliers, and wherein the frequency characteristic modifier generates a plurality of filter output signals by passing the target signal through the plurality of high-pass filters;

corrects the phase characteristics of the individual filter signals generated so as to make the phase characteristics nearly equal to the phase characteristics of the individual filter output signals using the phase correctors corresponding to the phase characteristics of the other high-pass filters;

causes the coefficient calculator to determine the individual gain coefficients in a manner that the sum of the individual gain coefficients of the plurality of multipliers has a fixed value; and causes the plurality of adders to add the individual filter output signals after assigning weights to the individual filter output signals passing through the phase correction in accordance with the individual gain coefficients the coefficient calculator determines.

8. The signal processing device according to claim 1, wherein the frequency characteristic modifier comprises;

a plurality of low-pass filters with different cutoff frequencies;

phase correctors that correct the phase characteristics of the target signal so as to make the phase characteristics nearly equal to phase characteristics of the individual low-pass filters;

a plurality of multipliers that adjust gains of signals output from the low-pass filters and the phase correctors;

a coefficient calculator that determines gain coefficients of the plurality of multipliers in a manner that the sum of the gain coefficients of the plurality of multipliers has a fixed value; and a plurality of adders that add signals output from the plurality of multipliers, and wherein the frequency characteristic modifier generates a plurality of filter output signals by passing the target signal through the plurality of low-pass filters;

corrects the phase characteristics of the individual filter signals generated so as to make the phase characteristics nearly equal to the phase characteristics of the individual filter output signals using the phase correctors corresponding to the phase characteristics of the other low-pass filters;

causes the coefficient calculator to determine the individual gain coefficients in a manner that the sum of the individual gain coefficients of the plurality of multipliers has a fixed value; and causes the plurality of adders to add the individual filter output signals after assigning weights to the individual filter output signals passing through the phase correction in accordance with the individual gain coefficients the coefficient calculator determines.

* * * * *